(12) United States Patent
Koopmann

(10) Patent No.: US 12,730,130 B2
(45) Date of Patent: Sep. 8, 2026

(54) MEASUREMENT APPLICATION SETUP AND METHOD

(71) Applicant: Rohde & Schwarz GmbH & Co. KG, Munich (DE)

(72) Inventor: Bendix Koopmann, Garching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 394 days.

(21) Appl. No.: 18/355,217

(22) Filed: Jul. 19, 2023

(65) Prior Publication Data

US 2024/0085461 A1 Mar. 14, 2024

(30) Foreign Application Priority Data

Sep. 8, 2022 (EP) .................................... 22194601

(51) Int. Cl.
*G01R 13/02* (2006.01)
*G01R 13/00* (2006.01)

(52) U.S. Cl.
CPC ....... *G01R 13/029* (2013.01); *G01R 13/0254* (2013.01)

(58) Field of Classification Search
CPC .. G01R 13/029; G01R 13/0254; G01R 13/00; G01R 13/02; G01R 13/0272; G01R 13/0209
USPC ............................................................ 702/67
See application file for complete search history.

(56) References Cited

U.S. PATENT DOCUMENTS

| | | | | |
|---|---|---|---|---|
| 6,621,913 | B1 | 9/2003 | de Vries | |
| 6,947,043 | B1 | 9/2005 | Klingman et al. | |
| 11,237,190 | B2 | 2/2022 | Rule et al. | |
| 2007/0118317 | A1 | 5/2007 | Corredoura | |
| 2016/0231357 | A1 | 8/2016 | Taratorin et al. | |
| 2020/0233016 | A1* | 7/2020 | Rule | G01R 13/28 |
| 2020/0342308 | A1 | 10/2020 | Werner | |
| 2021/0234539 | A1* | 7/2021 | Takao | H03K 17/04123 |
| 2021/0278441 | A1* | 9/2021 | Waldo | G01R 13/029 |
| 2023/0333148 | A1 | 10/2023 | Forsberg et al. | |

FOREIGN PATENT DOCUMENTS

| | | | | |
|---|---|---|---|---|
| CN | 106484817 A * | 3/2017 | G06F 16/9032 |
| EP | 2228661 A1 | 9/2010 | |
| WO | WO-2017133022 A1 * | 8/2017 | G01R 13/20 |

OTHER PUBLICATIONS

English translation of CN 106484817, Mar. 8, 2017. (Year: 2017).*
(Continued)

*Primary Examiner* — Michael P Nghiem
(74) *Attorney, Agent, or Firm* — Patterson + Sheridan, LLP; Carleton S. Clauss

(57) ABSTRACT

The present disclosure provides a measurement application setup comprising a signal processor configured to process measurement waveform data, a display that is coupled to the signal processor and that is configured to display at least part of the measurement waveform data, a user input device that is coupled to the signal processor, wherein the signal processor is configured to acquire a user input via the user input device, the user input resembling a search waveform that is to be searched by the signal processor in the measurement waveform data. Further, the present disclosure provides a respective method.

19 Claims, 7 Drawing Sheets

(56) References Cited

OTHER PUBLICATIONS

English translation of WO-2017133022, Aug. 10, 2017. (Year: 2017).*

European Patent Office, Extended European Search Report for Application 22194601.5-1001 dated Mar. 14, 2023.

* cited by examiner

MEASUREMENT APPLICATION SETUP AND METHOD

TECHNICAL FIELD

The disclosure relates to a measurement application setup and a respective method.

BACKGROUND

Although applicable to any type of measurement application device, like vector network analyzers, the present disclosure will mainly be described in conjunction with oscilloscopes.

During development or maintenance operations of electronic devices a plurality of measurements may be performed on the electronic devices.

A user that performs such measurements is usually looking for specific details of the acquired signals. In order to detect such specific details, measurement application devices, like oscilloscopes, offer the user to define trigger conditions that will trigger the measurement application device to show a specific section of the signal that is measured.

Defining complex trigger conditions is a complex task.

Accordingly, there is a need for providing a simplified trigger system in measurement application devices.

SUMMARY

The above stated problem is solved by the features of the independent claims. It is understood, that independent claims of a claim category may be formed in analogy to the dependent claims of another claim category.

Accordingly, it is provided:

A measurement application setup comprising a signal processor configured to process measurement waveform data, a display that is coupled to the signal processor and that is configured to controllably display at least part of the measurement waveform data, and a user input device that is coupled to the signal processor wherein the signal processor is configured to acquire a user input via the user input device, the user input resembling a search waveform that is to be searched by the signal processor in the measurement waveform data.

Further, it is provided:

A method for operating a measurement application setup, the measurement application setup comprising a signal processor, a display coupled to the signal processor, and a user input device coupled to the processor, the method comprising processing measurement waveform data with the signal processor, controllably displaying at least part of the measurement waveform data on the display, and acquiring a user input via the user input device with the processor, the user input resembling a search waveform that is to be searched by the signal processor in the measurement waveform data.

The present disclosure is based on the fact that known methods of defining triggers in measurement application devices are usually very complex and time intensive to use, or provide little flexibility in defining a trigger.

A simple type of trigger may, for example, allow a user to define a specific signal level, wherein the trigger condition is triggered whenever the signal that is acquired raises above the defined signal level. However, such a simple trigger may not be adequate to inspect signal conditions of interest in complex electronic systems.

The present disclosure, therefore, provides the measurement application setup that allows defining trigger conditions in a very flexible way. To this end, the measurement application setup comprises a signal processor that is coupled to a display and a user input.

The signal processor serves for processing measurement waveform data. The measurement waveform data may, for example, be measurement data that is acquired in the measurement application setup. To this end, the measurement application setup may comprise a measurement application device, like an oscilloscope, that acquires the measurement waveform data. Alternatively, the measurement waveform data may be provided from any other data source, like a measurement data server.

The expression "processing the measurement waveform data" comprises any operation that the signal processor may perform on the measurement waveform data. Possible operations may include, but are not limited to, displaying the measurement waveform data, adapting the displaying of the measurement waveform data according to a user input, performing calculations on the measurement waveform data, for example calculating a Fourier Transform, especially a Fast Fourier Transform, for the measurement waveform data, and generating predetermined diagrams for the measurement waveform data, like a Bode plot.

The signal processor may be provided as a dedicated processing element, like e.g., a processing unit, a microcontroller, a field programmable gate array, FPGA, a complex programmable logic device, CPLD, or the like. The signal processor may at least in part also be provided as a computer program product comprising computer readable instructions that may be executed by a processing element. In a further embodiment, the signal processor may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them.

In addition, it is understood, that any required supporting or additional hardware may be provided like e.g., a power supply circuitry and clock generation circuitry.

The display of the measurement application setup serves for displaying the measurement waveform data to a user, while the user input serves for acquiring user input.

In order to allow a user to flexibly define a trigger or trigger condition for the measurement waveform data, the signal processor acquires a user input that resembles a search waveform.

A user may expect a certain behavior of a device under test and may also have a rough estimation of the shape of the waveform that he expects to be measured or that he expects to be caused by an error in the device under test. The user will, therefore, have a clear idea of how the search waveform should look.

The user input may comprise an element that allows the user to paint or draw the search waveform on the display. Such an element may, for example, comprise but is not limited to a touch screen device, a mouse, a touchpad, and a joystick.

Of course, the display may show the search waveform as provided by the user. This allows the user to verify that the search waveform is received in the measurement application setup as intended.

The search waveform in the measurement application setup resembles a waveform that is to be searched by the signal processor in the measurement waveform data.

Accordingly, with the measurement application setup according to the present disclosure, a user may easily define complex trigger patterns without the need to input detailed parameters for such a complex trigger pattern. Instead, the user may simply paint a waveform i.e., the search waveform, on the display.

Further embodiments of the present disclosure are subject of the further dependent claims and of the following description, referring to the drawings.

In an embodiment, the signal processor may further be configured to identify data sections in the measurement waveform data that correspond to the search waveform.

As explained above, a user may easily define complex trigger conditions by painting or drawing a respective search waveform on the display.

After receiving a corresponding search waveform via a user input, the signal processor may then search for a data section in the measurement waveform data that corresponds to the search waveform.

It is understood, that a manually provided search waveform may not be an exact representation of the data section in the measurement waveform data that a user may be looking for. Instead, the search waveform may be a rather rough or generalized representation of such a data section.

The signal processor may, consequently, take into account that the search waveform may in certain cases not be an exact representation of the data section that is to be identified. When identifying the data sections the signal processor may, consequently, search for data sections that comprise at least some similarities with the search waveform. Such similarities may, for example, refer to the data sections comprising at least one of essentially the same variations in slope or gradient as the search waveform, essentially the same ratios between absolute values at specific sections, for example, between local maxima and minima, and essentially the same relative positions of local maxima and minima. In this context, the expression "essentially the same" is to be understood as the respective measure comprising a certain deviation or variation between the search waveform and the respective data section. In embodiments, the measure may be the relation of the respective parameter in the search waveform and a potential data section.

It is understood, that the signal processor may apply any adequate type of pre-processing to the measurement waveform data and the search waveform prior to searching for the search waveform in the measurement waveform data. Such pre-processing may, for example, comprise normalizing the amplitudes of the measurement waveform data and the search waveform, or normalizing the measurement waveform data and the search waveform on the time axis or the frequency axis (in the frequency domain).

Identifying a data section may be seen as a kind of applying a trigger to the measurement waveform data. The signal processor may after identifying a data section, for example, display the identified data section for further analysis to the user.

In another embodiment, when identifying data sections, the signal processor may be configured to identify the data sections based on a predetermined similarity value that the signal processor calculates for the search waveform and the data sections.

The similarity value may be implemented as any measure that allows the signal processor to determine if a data section of the measurement waveform data is similar to the search waveform to at least some extent. The similarity value may be seen as a measure for the degree of similarity of the search waveform and data sections in the measurement waveform data.

The parameters explained above may for example be used as a basis for calculating the similarity value. While calculating the similarity value, the deviation or variation between the search waveform and the respective data sections in the respective parameter may be used as a basis for calculating the similarity value.

It is understood, that a threshold value may be predetermined in the measurement application setup or by the user to determine a minimum similarity value to include a data section in the results of similar data sections.

In a further embodiment, when identifying data sections, the signal processor may be configured to apply at least one of a neural network trained to identify the data sections based on the search waveform, a (hidden) Markov model, a wavelet or filter representation, and a dynamic time warping method.

As explained above, the signal processor after receiving a user input with regard to a search waveform tries to identify the data sections in the measurement waveform data that are similar to the search waveform, at least to a certain degree.

Identifying the data sections may be performed based on the parameters as disclosed earlier in this disclosure. In embodiments, the signal processor may as alternative, or in addition, use at least one of a neural network trained to identify the data sections based on the search waveform, a (hidden) Markov model, a wavelet or filter, and a dynamic time warping method.

Neural networks may be trained to identify a sample in a set of input data. In the case of the present disclosure, a neural network may, therefore, be trained to identify data sections that are similar to a waveform i.e., the search waveform, in a set of input data i.e., the measurement waveform data. Such a neural network may determine one or more than one candidate data sections in the measurement waveform data and may further provide a similarity value or measure for each one of the candidate data sections.

A (hidden) Markov model is a stochastic model that may especially be used in pattern recognition tasks. Since the identification of the search waveform in the measurement waveform data is basically a pattern recognition task, a (hidden) Markov model is an adequate algorithm for identifying possible data sections.

The signal processor may also calculate a wavelet or filter representation of the search waveform and perform the same calculation for data sections or windows of the measurement waveform data. Instead of comparing the waveforms, the signal processor may then compare the wavelet or filter representations i.e., the parameters or variables of the wavelet of filter representations.

As further additional or alternative method, the signal processor may also apply a dynamic time warping algorithm to identify the search waveform in the measurement waveform data. A dynamic time warping algorithm in time series analysis is usually used for measuring similarity between two temporal sequences. Since the search waveform and the measurement waveform data are both time series of data points, the dynamic time warping algorithms are an adequate type of algorithm to identify the relevant data sections in the measurement waveform data.

In yet another embodiment, the measurement application setup may further comprise a signal processing circuitry configured to acquire the measurement waveform data.

The signal processing circuitry may comprise any type of circuitry that is required to acquire the measurement waveform data.

Such signal processing circuitry may, for example, comprise, but is not limited to, a measurement frontend, amplifiers, attenuators, trigger circuits, and an acquisition memory.

It is understood, that in the measurement application setup the signal processing circuitry may be provided as a dedicated device, while the signal processor, the display, and the user input device may be provided in another device. Such a signal processing circuitry may for example provide the acquired measurement waveform data to the other device via a data interface, like a USB interface or an Ethernet interface.

Such a signal processing circuitry may also store the acquired measurement waveform data on a remote location for later processing by the other device.

In an embodiment, the measurement application setup may comprise a measurement application device, especially an oscilloscope, wherein the signal processing circuitry may be provided in the measurement application device.

Instead of providing a dedicated device for the signal processing circuitry, the measurement application setup may also comprise a measurement application device, like an Oscilloscope or a Vector Network Analyzer, VNA, that comprises the signal processor, the display, the user input, and the signal processing circuitry.

In embodiments, the measurement application setup may for example comprise only the measurement application device, and a device under test that may be coupled to the measurement application device via respective measurement cables.

In another embodiment, the signal processor may further be configured to receive the user input prior to controlling the display to display at least part of the measurement waveform data.

If the signal processor receives the user input prior to showing the measurement waveform data to the user, and in embodiments also prior to acquiring the measurement waveform data in the measurement application setup, identifying the relevant data sections may be used like a kind of real-time trigger in the measurement application setup while the measurement waveform data is acquired.

However, instead of providing the limited capabilities of a standard trigger, using the search waveform allows defining complex conditions for identifying relevant sections in the acquired or to be shown measurement waveform data.

In a further embodiment, the user input may refer to a section of the measurement waveform data.

Instead of, for example, drawing the search waveform on the display, a user may also use sections of the measurement waveform data as template for the search waveform.

In such an embodiment, the user input may resemble the search waveform indirectly by referring to a section of the measurement waveform data that is to be used as search waveform.

In embodiments, the user may for example chose how to enter the search waveform, for example, via a user interface. If the user selects to input the search waveform via selecting a section of the measurement waveform data, the user may then for example be offered the possibility to draw a rectangle or otherwise mark the respective section of the measurement waveform data, for example by swiping from the start to the end of the respective section.

The user-selected section of the measurement waveform data may then be directly used or may be used as template for the search waveform.

In yet another embodiment, the user input may refer to at least one of a calculation rule for the search waveform, an inverse FFT, a library entry, data from a CAD software, an image, especially a photograph or a screenshot, and stored measurement waveform data.

As further alternatives to drawing the search waveform directly, the user may be offered various alternatives of providing a user input to define the search waveform.

A calculation rule may comprise any mathematical or parametrized representation of a graph or curve that allows the user to input the respective variables or parameters for defining the graph or curve that is to be used as search waveform.

The user input may also comprise an inverse FFT of a frequency domain representation that the user may provide or define for the search waveform.

Another user input may also comprise a selection of a library entry from a library of possible search waveforms. Such a library may be provided in a memory in the measurement application setup that may be accessed by the signal processor to retrieve the signal library entries and show them to the user. It is understood, that the memory may be provided in the measurement application setup or external to the measurement application setup.

An external memory may, for example, be provided in a database that comprises search waveforms for different application fields. Such a database may be operated by the manufacturer or vendor of the measurement application setup.

The user input may also refer to or comprise data from a CAD software. The CAD software may, for example, comprise a software for design electric or electronic circuits and simulate signals in such circuits. Especially, the waveforms or sections of the waveforms that are generated by such simulations may be provided via a user input to the processor directly as or as basis for the search waveform.

A further type of user input may comprise an image, especially a photograph or a screenshot. The processor may, in case of images being provided with the user input, analyze the images for the presence of waveform-like objects in the images and offer the user to use a detected waveform-like object directly as or as basis for a search waveform.

If in the present disclosure it is mentioned that a waveform or graph or any other object is used as basis or template for a search waveform, it is understood, that the respective waveform or graph or any other object may be used directly as the search waveform. As alternative, the user may be offered the possibility to modify the waveform or graph or any other object. The user may in embodiments be provided for example with scaling functions to scale the waveform prior to using it as a search waveform in any axis. The user may also be provided with a function to move single points of the waveform prior to using the waveform as search waveform. To this end, the waveform may be vectorized by the signal processor and the single points of the curve or graph may be shown as dots or crosses to the user for dragging.

In an embodiment, the signal processor may further be configured to provide the user with an indication of possible search waveforms based on the user input, and receive a selection user input that selects one of the possible search waveforms.

After receiving a user input, the signal processor may identify possible search waveforms based on the user input.

The user input may for example comprise a waveform drawn by the user on the display.

The processor may then search possible search waveforms, for example, in a search waveform database, as already mentioned above, or in the measurement waveform data. Of course, the signal processor may perform a similarity search between the user provided waveform and the possible candidate search waveforms.

If the possible search waveforms are provided based on the measurement waveform data, the signal processor may perform a rough search of the provided waveform in the measurement waveform data, wherein the similarity threshold may be larger i.e., a larger deviation is accepted, for this rough search, than for the following actual search.

The user may then be provided with an indication of the possible candidate search waveforms for selecting the search waveform. The signal processor may in embodiments provide a list with possible candidate search waveforms to the user. As alternative, the processor may control the display to show a popup at the end of the waveform as drawn by the user that provides preview views of the candidate search waveforms.

In another embodiment, the signal processor may further be configured to, after receiving a user input resembling a search waveform, identify data sections in the measurement waveform data that correspond to the provided search waveform, and identify data sections in the measurement waveform data that correspond to search waveforms that are similar to the provided search waveform, and display the provided search waveform and the similar search waveforms together with an indication of the number of data sections that are identified for the respective search waveform.

The processor in this embodiment, automatically searches for the search waveform provided by the user, and further search waveforms that are similar to the provided search waveform. "Similar" in this regards refers to any of the above-mentioned measures for determining similarity between two waveforms.

In embodiments, when the search results are shown to the user, only the results for the similar search waveforms with the highest similarity to the user-provided search waveform may be show, wherein the number of similar search waveforms to be shown may be predetermined or user configurable.

The number of data sections for the single search waveforms may be provided as absolute value. In addition, or as alternative, the number may also be provided as percentage with regard to all identified data sections, especially including the data sections identified for search waveforms that are not shown to the user.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
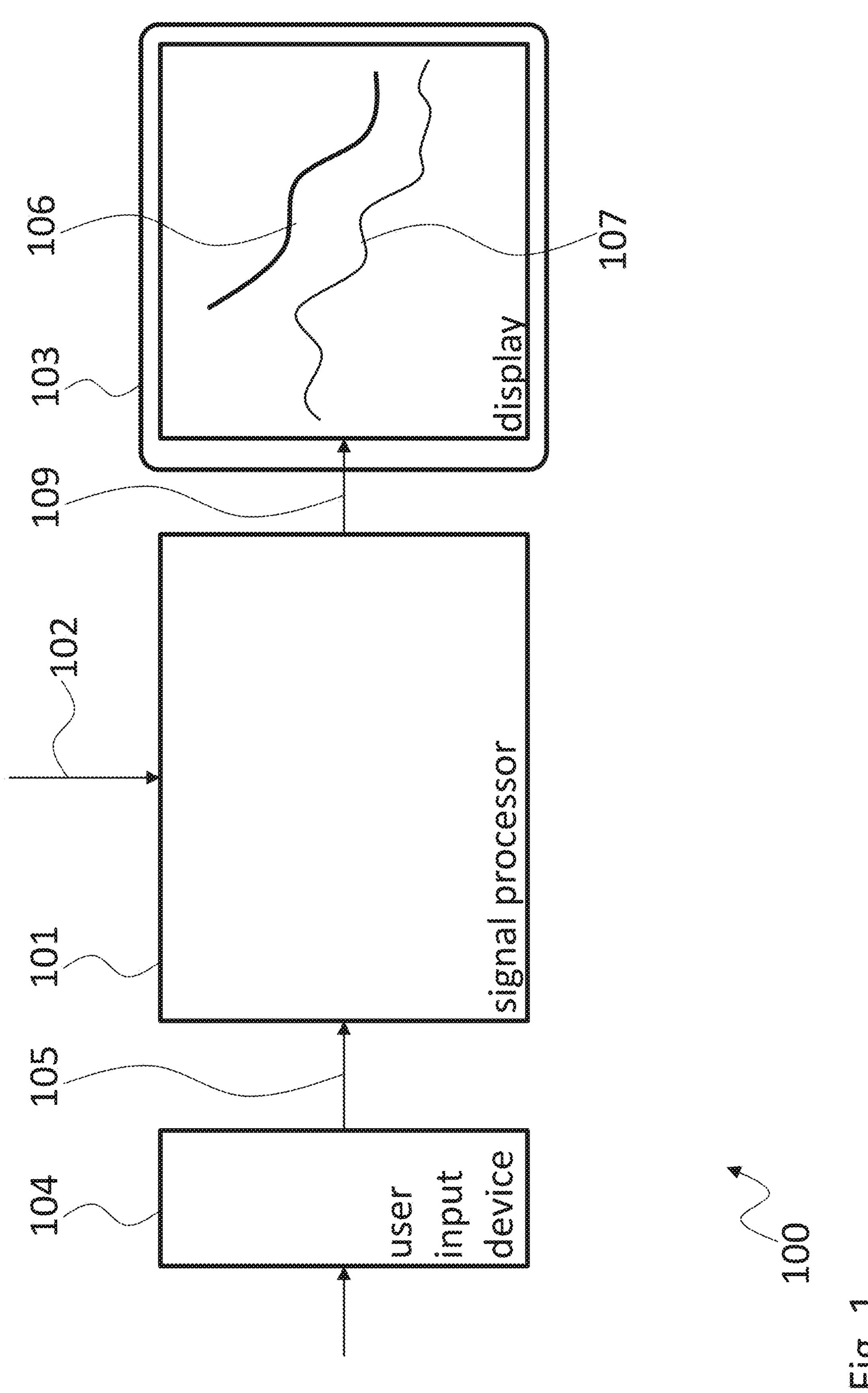
FIG. 1 shows a block diagram of an embodiment of a measurement application setup according to the present disclosure.

FIG. 1 shows a block diagram of a measurement application setup 100. The measurement application setup 100 comprises a signal processor 101 that is coupled to a display 103. The measurement application setup 100 further comprises a user input device 104 that is also coupled to the signal processor 101.

During operation of the measurement application setup 100, the signal processor 101 may operate on measurement waveform data 102. Such measurement waveform data 102 may, for example, be provided from an external data source. As will be explained in conjunction with FIG. 2, the measurement waveform data 102 may also be acquired in the measurement application setup 100.

The signal processor 101 may control the display 103 to show a waveform 107 resembling the measurement waveform data 102 on the display 103 for analysis by the user. In this regard, the measurement application setup 100 is similar to a measurement application device, like an oscilloscope.

In addition, the signal processor 101 may receive a user input 105 via the user input device 104. This user input 105 resembles a search waveform 106 that a user is looking for in the measurement waveform data 102.

After receiving the user input 105, the signal processor 101 tries to identify data sections in the measurement waveform data 102, that are similar to the search waveform 106 provided by the user.

If such a data section is identified in the measurement waveform data 102, the identified data section may be shown to the user for detailed analysis.

It is understood, that the signal processor 101 may use different methods or algorithms to identify the data sections. The signal processor 101 may, for example, identify the data sections based on a predetermined similarity value that the signal processor 101 may calculate for the search waveform 106 and the data sections. Possible algorithms or methods may be a neural network trained to identify the data sections based on the search waveform 106, a (hidden) Markov model, a wavelet or filter representation, and a dynamic time warping method.

Figure 2:
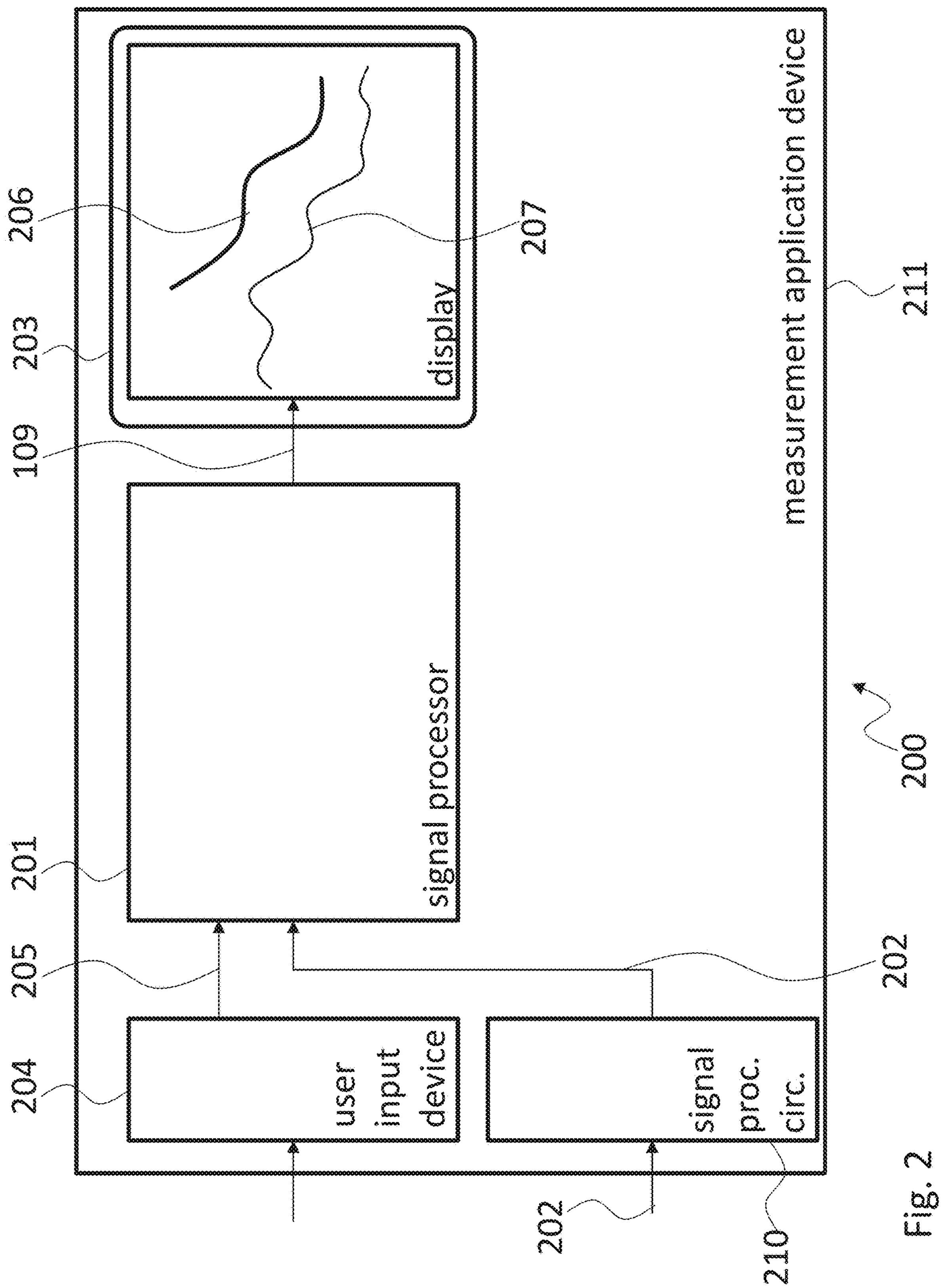
FIG. 2 shows a block diagram of another embodiment of a measurement application setup according to the present disclosure.

FIG. 2 shows a block diagram of another measurement application setup 200. The measurement application setup 200 is based on the measurement application setup 100. Consequently, the measurement application setup 200 comprises a signal processor 201 that is coupled to a display 203. The measurement application setup 200 further comprises a user input device 204 that is also coupled to the signal processor 201. In addition, in the measurement application setup 200, the above-mentioned elements are provided in a measurement application device 211 that in addition comprises a signal processing circuitry 210. The signal processing circuitry 210 is coupled to the signal processor 201 and provides the measurement waveform data 202 to the signal processor 201.

It is understood, that the measurement application device 211 may be provided as any kind of measurement application device, like an oscilloscope or a network analyzer.

In the measurement application device 211 of the measurement application setup 200, the measurement waveform data 202 is directly acquired via the signal processing circuitry 210. To this end, the signal processing circuitry 210 may comprise any required component, like a measurement frontend, amplifiers, attenuators, trigger circuits, and an acquisition memory.

Of course, the signal processor 201 may in addition (although not explicitly shown) comprise a data interface for receiving the measurement waveform data 202 from an external source. Such a data interface may exemplarily comprise a USB interface or an Ethernet interface.

Figure 3:
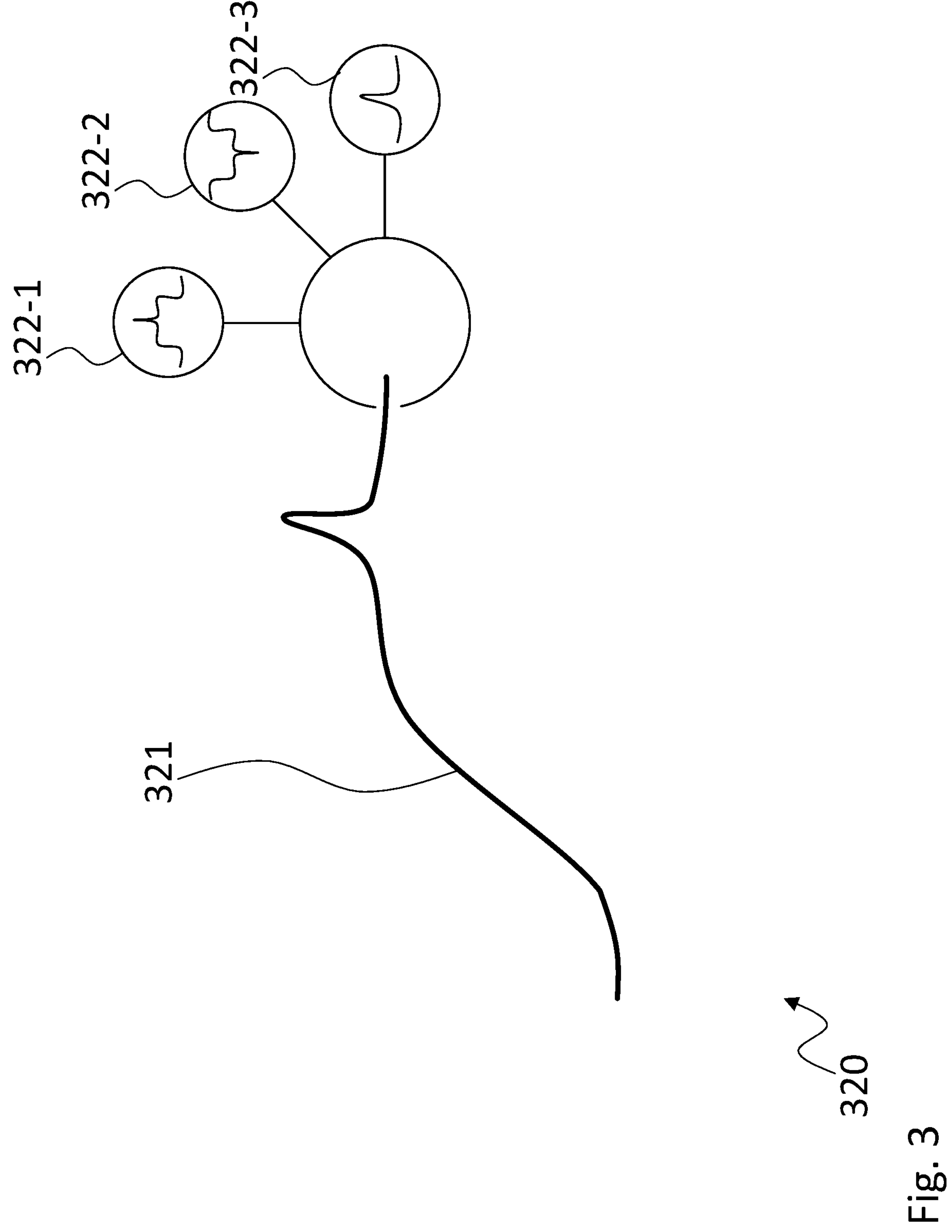
FIG. 3 shows a diagram of suggested possible search waveforms as may be shown in an embodiment of a measurement application setup according to the present disclosure.

FIG. 3 shows a display 320 of suggested possible search waveforms 322-1, 322-2, 322-3 as may be shown in any embodiment of a measurement application setup according to the present disclosure.

The display 320 may be created by the signal processor after receiving the user input. In order to create the display 320, the signal processor may analyze the search waveform 321 provided via the user input and identify possible search waveforms 322-1, 322-2, 322-3 for suggestion to the user. It is understood, that although three possible search waveforms 322-1, 322-2, 322-3 are shown in FIG. 3, any other number of possible search waveforms is possible.

The processor may determine the possible search waveforms 322-1, 322-2, 322-3 by searching for the search waveforms in a search waveform database that comprises different search waveforms, especially grouped by applications or application fields. Of course, each of the possible search waveforms 322-1, 322-2, 322-3 may also be provided with a textual indication of the specific features in the measurement waveform data of the respective application or application field the respective possible search waveform 322-1, 322-2, 322-3 pertains to.

In addition, or alternatively, the signal processor may search for search waveforms that are similar to the user provided search waveform 312 in the measurement waveform data and suggest respective sections of the measurement waveform data as possible search waveforms 322-1, 322-2, 322-3.

In the display 320, the possible search waveforms 322-1, 322-2, 322-3 are shown at the end of the search waveform 321 as provided by the user. The user may then, for example and if present, use a touch screen user input device to select one of the possible search waveforms 322-1, 322-2, 322-3.

In alternative embodiments, the possible search waveforms 322-1, 322-2, 322-3 may also be shown in tabular form or as preview icons arranged in a grid on the display.

Figure 4:
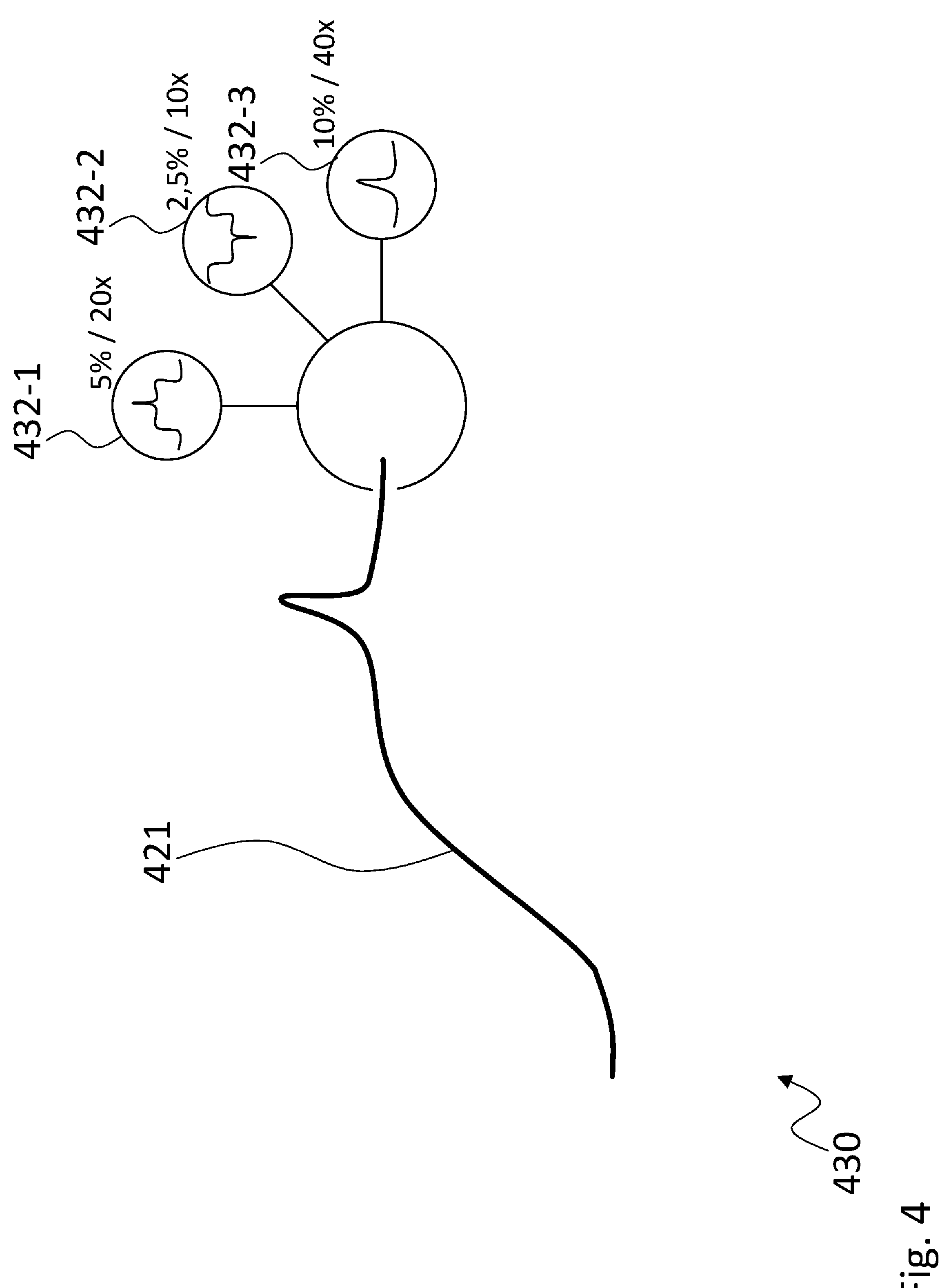
FIG. 4 shows a diagram of search waveforms with the number of identified data sections as may be shown in an embodiment of a measurement application setup according to the present disclosure.

FIG. 4 shows a diagram 430 of search waveforms 432-1, 432-2, 432-3 with the number of identified data sections as may be shown in an embodiment of a measurement application setup according to the present disclosure;

In contrast to the diagram 320 that is shown prior to identifying data sections that are similar to the selected search waveform, the diagram 430 shows search waveforms 432-1, 432-2, 432-3 for which similar data sections could be identified in the measurement waveform data based on a user input search waveform 421.

In this embodiment, the processor automatically identified a plurality of possible search waveforms, similar to the possible search waveforms shown in diagram 320. However, instead of having a user chose one of the search waveforms, the processor proceeded to identify data sections in the measurement waveform data for all possible search waveforms.

After identifying all data sections, the processor controls the display to show the search waveforms 432-1, 432-2, 432-3 for which the most data sections could be identified. In addition to showing the search waveforms 432-1, 432-2, 432-3, in diagram 430 a textual indication of the number of identified data sections is also shown.

For search waveform 432-1 5% of the total identified data sections or an absolute number of 20 could be identified. For search waveform 432-2 2.5% of the total identified data sections or an absolute number of 10 could be identified. For search waveform 432-3 10% of the total identified data sections or an absolute number of 40 could be identified.

In the measurement application setup, a minimum threshold may be provided for showing the search waveforms 432-1, 432-2, 432-3 to the user. In diagram 430, the minimum threshold may for example be set to 2.5%. Any search waveforms for which less than 2.5% of the total identified data sections are identified is, therefore, not shown.

It is understood, that this minimum threshold value is optional and may be user configurable.

Figure 5:
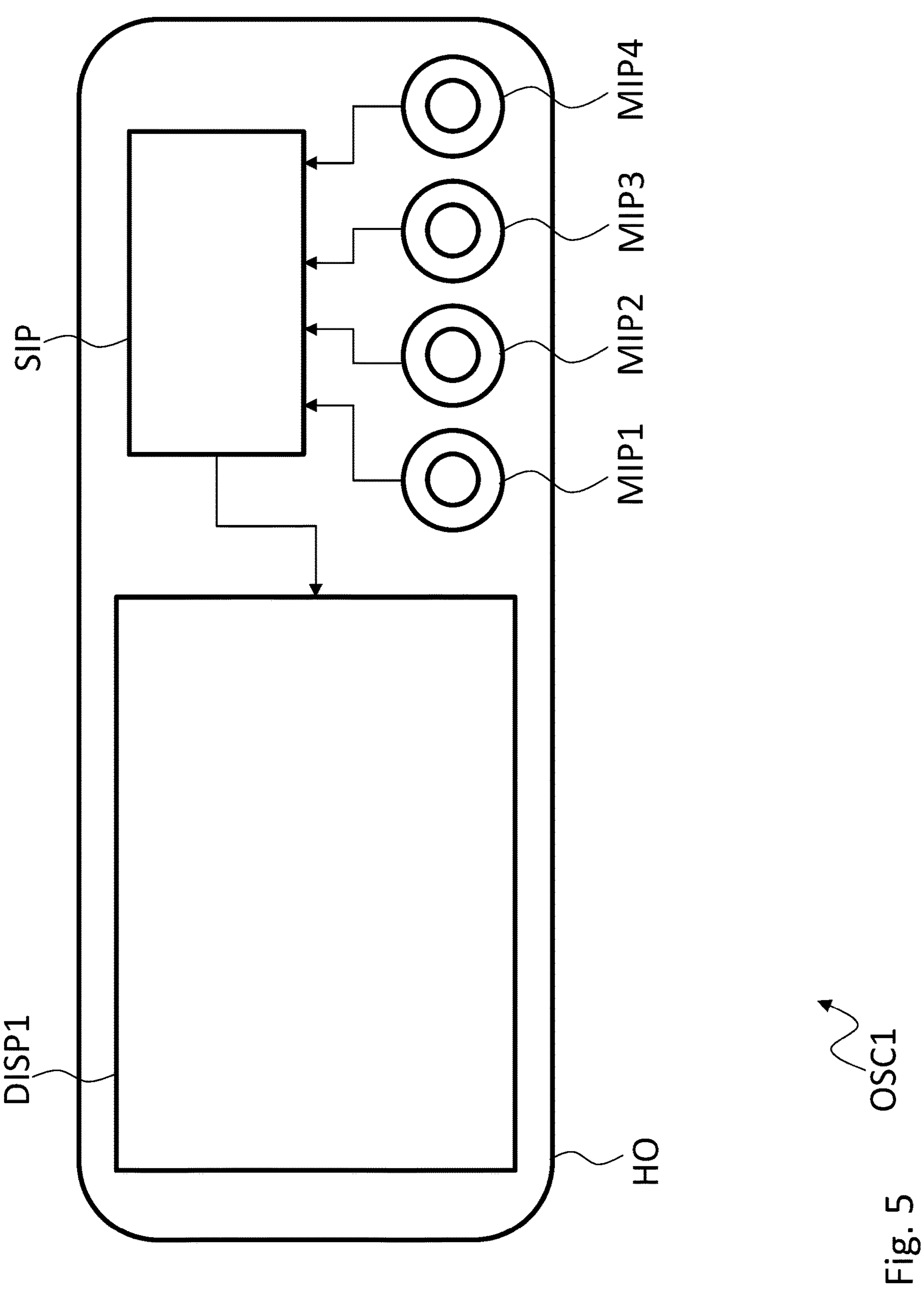
FIG. 5 shows a block diagram of an embodiment of a measurement application device as may be used in an application setup according to the present disclosure.

FIG. 5 shows a block diagram of an oscilloscope OSC1 that may be used in an embodiment of a measurement application setup according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user.

Although not explicitly shown, it is understood, that the oscilloscope OSC1 may also comprise signal outputs. Such signal outputs may for example serve to output calibration signals. Such calibration signals allow calibrating the measurement application setup prior to performing any measurement. The process of calibrating and correcting any measurement signals based on the calibration may also be called de-embedding and may comprise applying respective algorithms on the measured signals.

It is understood, that the signal processor SIP may implement the functions disclosed in this disclosure with regard to the signal processor of the measurement application setup, and that the display DISP1 may serve as the display of the measurement application setup.

In an embodiment of the measurement application setup with a signal processing circuitry, the measurement inputs MIP1, MIP2, MIP3, MIP4 may implement such a signal processing circuitry.

Figure 6:
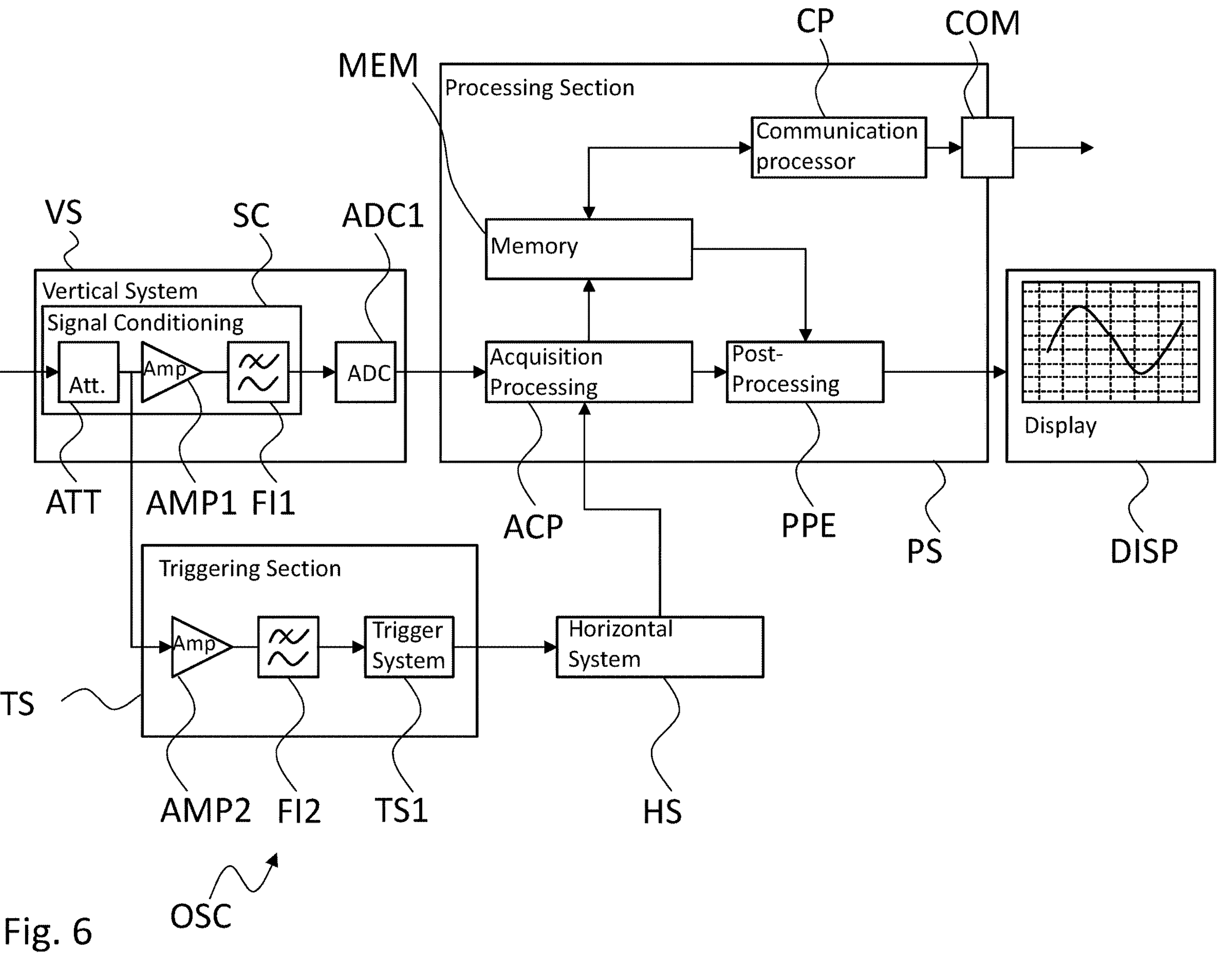
FIG. 6 shows a block diagram of an embodiment of another measurement application device as may be used in an application setup according to the present disclosure.

FIG. 6 shows a block diagram of an oscilloscope OSC that may be an implementation of a measurement application device according to the present disclosure. The oscilloscope OSC is implemented as a digital oscilloscope. However, the present disclosure may also be implemented with any other type of oscilloscope.

The oscilloscope OSC exemplarily comprises five general sections, the vertical system VS, the triggering section TS, the horizontal system HS, the processing section PS and the display DISP. It is understood, that the partitioning into five general sections is a logical partitioning and does not limit the placement and implementation of any of the elements of the oscilloscope OSC in any way.

The vertical system VS mainly serves for attenuating or amplifying a signal to be acquired. The signal may for example be modified to fit the signal in the available space on the display DISP or to comprise a vertical size as configured by a user.

To this end, the vertical system VS comprises a signal conditioning section SC with an attenuator ATT that is coupled to an amplifier AMP1. The amplifier AMP1 is coupled to a filter F11, which in the shown example is provided as a low pass filter. The vertical system VS also comprises an analog-to-digital converter ADC1 that receives the output from the filter F11 and converts the received analog signal into a digital signal.

The attenuator ATT and the amplifier AMP1 serve to scale the waveform of the signal and to condition the amplitude of the signal to be acquired to match the operation range of the analog-to-digital converter ADC1. The filter F11 serves to filter out unwanted high frequency components of the signal to be acquired.

The triggering section TS comprises an amplifier AMP2 that is coupled to a filter F12, which in this embodiment is implemented as a low pass filter. The filter FI2 is coupled to a trigger system TS1.

The triggering section TS serves to capture predefined signal events and allows the horizontal system HS to e.g., display a stable view of a repeating waveform, or to simply display waveform sections that comprise the respective signal event. It is understood, that the predefined signal event may be configured by a user via a user input of the oscilloscope OSC.

Possible predefined signal events may for example include, but are not limited to, when the signal crosses a predefined trigger threshold in a predefined direction i.e., with a rising or falling slope. Such a trigger condition is also called an edge trigger. Another trigger condition is called “glitch triggering” and triggers, when a pulse occurs in the signal to be acquired that has a width that is greater than or less than a predefined amount of time.

The triggering section TS operates on the signal as provided by the attenuator ATT, which is fed into the amplifier AMP2. The amplifier AMP2 serves to condition the input signal to the operating range of the trigger system TS1. It is understood, that a common amplifier may also be used instead of the dedicated amplifiers AMP1 and AMP2.

In order to allow an exact matching of the trigger event and the waveform that is shown on the display DISP, a common time base may be provided for the analog-to-digital converter ADC1 and the trigger system TS1.

It is understood, that although not explicitly shown, the trigger system TS1 may comprise at least one of configurable voltage comparators for setting the trigger threshold voltage, fixed voltage sources for setting the required slope, respective logic gates like e.g., a XOR gate, and FlipFlops to generate the triggering signal.

The triggering section TS is exemplarily provided as an analog trigger section. It is understood, that the oscilloscope OSC may also be provided with a digital triggering section. Such a digital triggering section will not operate on the analog signal as provided by the attenuator ATT but will operate on the digital signal as provided by the analog-to-digital converter ADC1.

A digital triggering section may comprise a processing element, like a processor, a DSP, a CPLD or an FPGA to implement digital algorithms that detect a valid trigger event.

The horizontal system HS is coupled to the output of the trigger system TS1 and mainly serves to position and scale the signal to be acquired horizontally on the display DISP.

The above explanations refer to a triggering section TA as it may be provided in an oscilloscope OSC1 in addition to the functionality of the measurement application setup as described herein.

The oscilloscope OSC further comprises a processing section PS that implements digital signal processing and data storage for the oscilloscope OSC. The processing section PS comprises an acquisition processing element ACP that is couple to the output of the analog-to-digital converter ADC1 and the output of the horizontal system HS as well as to a memory MEM and a post processing element PPE.

The acquisition processing element ACP manages the acquisition of digital data from the analog-to-digital converter ADC1 and the storage of the data in the memory MEM. The acquisition processing element ACP may for example comprise a processing element with a digital interface to the analog-to-digital converter ADC1 and a digital interface to the memory MEM. The processing element may for example comprise a microcontroller, a DSP, a CPLD or an FPGA with respective interfaces. In a microcontroller or DSP, the functionality of the acquisition processing element ACP may be implemented as computer readable instructions that are executed by a CPU. In a CPLD or FPGA the functionality of the acquisition processing element ACP may be configured in to the CPLD or FPGA.

The processing section PS further comprises a communication processor CP and a communication interface COM.

The communication processor CP may be a device that manages data transfer to and from the oscilloscope OSC. The communication interface COM for any adequate communication standard like for example, Ethernet, WIFI, Bluetooth, NFC, an infra-red communication standard, and a visible-light communication standard.

The communication processor CP is coupled to the memory MEM and may use the memory MEM to store and retrieve data.

Of course, the communication processor CP may also be coupled to any other element of the oscilloscope OSC to retrieve device data or to provide device data that is received from the management server.

The post processing element PPE may be controlled by the acquisition processing element ACP and may access the memory MEM to retrieve data that is to be displayed on the display DISP. The post processing element PPE may condition the data stored in the memory MEM such that the display DISP may show the data e.g., as waveform to a user.

The display DISP controls all aspects of signal representation to a user, although not explicitly shown, may comprise any component that is required to receive data to be displayed and control a display device to display the data as required.

It is understood, that even if it is not shown, the oscilloscope OSC may also comprise a user interface for a user to interact with the oscilloscope OSC. Such a user interface may comprise dedicated input elements like for example knobs and switches. At least in part the user interface may also be provided as a touch sensitive display device.

It is understood, that all elements of the oscilloscope OSC that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope OSC and not necessarily need to be partitioned into the different sections explained above.

The functionality of the measurement application setup may, for example, be provided in a processing element of the triggering section, in the signal processor SIP or in any processing element of the processing section PS or in a dedicated processing element.

For sake of clarity in the following description of the method-based FIG. 7 the reference signs used above in the description of apparatus based FIGS. 1-6 will be maintained.

Figure 7:
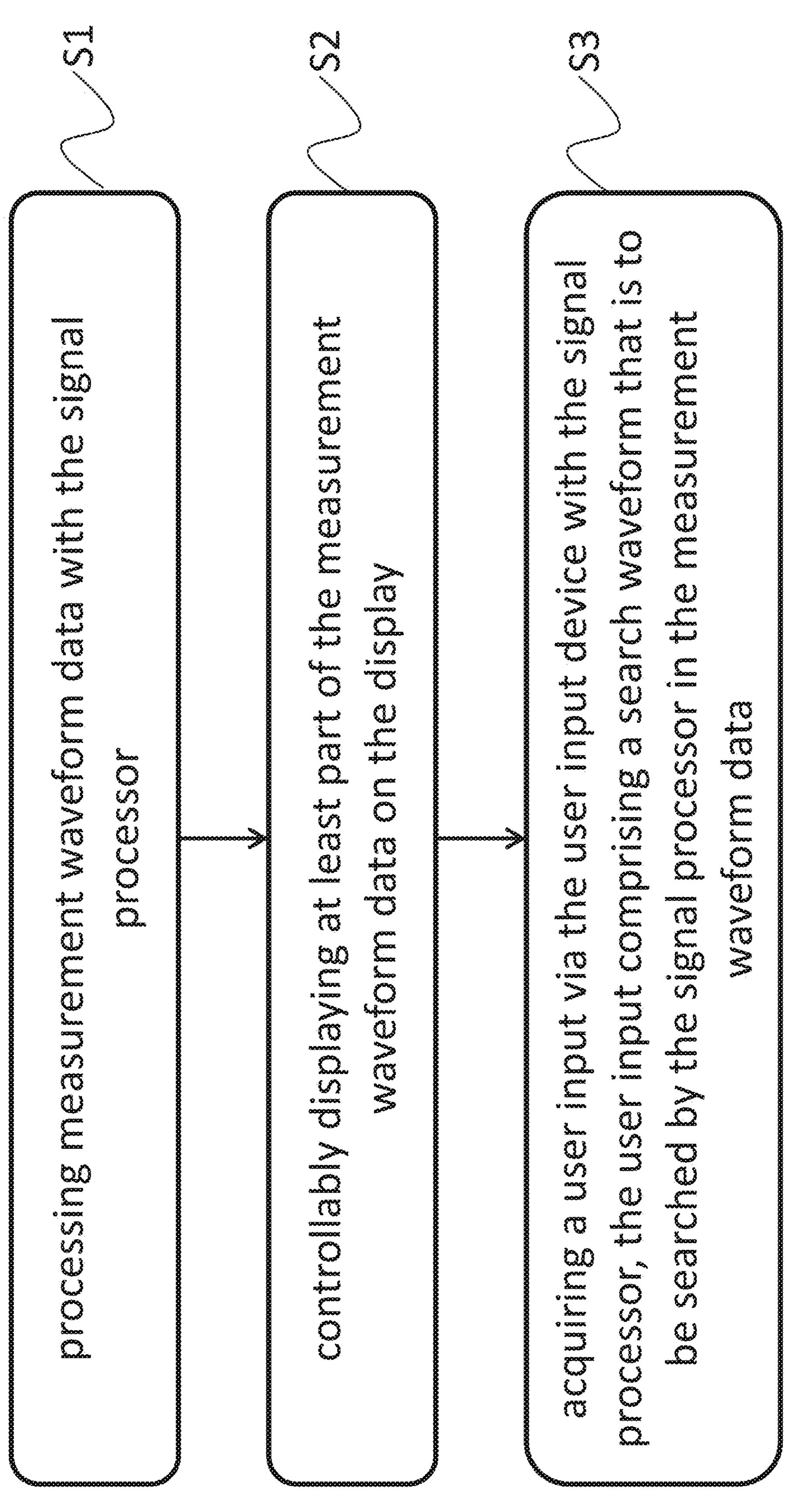
FIG. 7 shows a flow diagram of an embodiment of a method according to the present disclosure.

FIG. 7 shows a method for operating a measurement application setup 100, 200, as it is shown exemplarily in FIGS. 1 and 2. Such a measurement application setup 100, 200 comprises a signal processor 101, 201, a display 103, 203 coupled to the signal processor 101, 201, and a user input device 104, 204 coupled to the processor.

The method comprises processing S1 measurement waveform data 102, 202 with the signal processor 101, 201, controllably S2 displaying at least part of the measurement waveform data 102, 202 on the display 103, 203, and acquiring S3 a user input 105, 205 via the user input device 104, 204 with the processor, the user input 105, 205 resembling a search waveform 106, 306, 406 that is to be searched by the signal processor 101, 201 in the measurement waveform data 102, 202.

When applying the search waveform 106, 306, 406 the method may further comprise identifying data sections in the measurement waveform data 102, 202 that correspond to the search waveform 106, 306, 406 with the signal processor 101, 201.

In embodiments, the user input 105, 205 may be received prior to controlling the display 103, 203 to display at least part of the measurement waveform data 102, 202.

The user input 105, 205 may refer to a section of the measurement waveform data 102, 202. Alternatively, the user input 105, 205 may refer to at least one of a calculation rule for the search waveform 106, 306, 406, an inverse FFT, a library entry, data from a CAD software, an image, especially a photograph or a screenshot, and stored measurement waveform data 102, 202.

When identifying data sections, the data sections may be identified based on a predetermined similarity value that the signal processor 101, 201 calculates for the search waveform 106, 306, 406 and the data sections. Different methods or algorithms may be implemented for identifying the data sections. Exemplary methods and algorithms comprise, but are not limited to, at least one of a neural network trained to identify the data sections based on the search waveform 106, 306, 406, a hidden Markov model, a wavelet or filter representation, and a dynamic time warping method with the signal processor 101, 201.

The measurement waveform data 102, 202 may be acquired with a signal processing circuitry 210. In embodiments, the method may be performed in a measurement application device 211, and the measurement waveform data 102, 202 may be acquired with the measurement application device 211, wherein the signal processing circuitry 210 is provided in the measurement application device 211.

The method may further comprise providing the user with an indication of possible search waveforms 106, 306, 406 based on the user input 105, 205, and receiving a selection user input that selects one of the possible search waveforms 106, 306, 406.

In addition, or as alternative, after receiving a user input 105, 205 resembling a search waveform 106, 306, 406, the method may comprise identifying data sections in the measurement waveform data 102, 202 that correspond to the provided search waveform 106, 306, 406, and identifying data sections in the measurement waveform data 102, 202 that correspond to search waveforms 106, 306, 406 that are similar to the provided search waveform 106, 306, 406, and displaying the provided search waveform 106, 306, 406 and the similar search waveforms 106, 306, 406 together with an indication of the number of data sections that are identified for the respective search waveform 106, 306, 406.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

LIST OF REFERENCE SIGNS

100, 200 measurement application setup
101, 201 signal processor
102, 202 measurement waveform data
103, 203 display
104, 204 user input device
105, 205 user input
106 search waveform
107 waveform
210 signal processing circuitry
211 measurement application device
320 display of possible search waveforms
321, 421 search waveform
322-1, 322-2, 322-3 indication of possible search waveforms
430 display of search waveforms with number of data sections
432-1, 432-2, 432-3 indication search waveform with number of data sections
OSC1 oscilloscope
HO housing
MIP1, MIP2, MIP3, MIP4 measurement input
SIP signal processing
DISP1 display
OSC oscilloscope
VS vertical system
SC signal conditioning
ATT attenuator
AMP1 amplifier
FI1 filter
ADC1 analog-to-digital converter
TS triggering section
AMP2 amplifier
FI2 filter
TS1 trigger system
HS horizontal system
PS processing section
ACP acquisition processing element
MEM memory
PPE post processing element
DISP display
S1-S3 method steps

The invention claimed is:

1. A measurement application setup comprising:
a signal processor configured to process measurement waveform data;
a display that is coupled to the signal processor and that is configured to controllably display at least part of the measurement waveform data; and
a user input device that is coupled to the signal processor;
wherein the signal processor is configured to:
acquire a user input via the user input device, the user input comprising a search waveform,
provide a user with an indication of possible search waveforms based on the user input, and
receive a selection user input that selects one of the possible search waveforms, wherein the one of the possible search waveforms is to be searched by the signal processor in the measurement waveform data.

2. The measurement application setup according to claim 1, wherein the signal processor is further configured to identify data sections in the measurement waveform data that correspond to the one of the possible search waveforms.

3. The measurement application setup according to claim 2, wherein when identifying the data sections, the signal processor is configured to identify the data sections based on a predetermined similarity value that the signal processor calculates for the one of the possible search waveforms and the data sections.

4. The measurement application setup according to claim 2, wherein when identifying the data sections, the signal processor is configured to apply at least one of a neural network trained to identify the data sections based on the one of the possible search waveforms, a Markov model, a hidden Markov model, a wavelet or filter representation, or a dynamic time warping method.

5. The measurement application setup according to claim 1, further comprising a signal processing circuitry configured to acquire the measurement waveform data.

6. The measurement application setup according to claim 5, further comprising a measurement application device, wherein the signal processing circuitry is provided in the measurement application device.

7. The measurement application setup according to claim 1, wherein the signal processor is further configured to receive the user input prior to controlling the display to display at least part of the measurement waveform data.

8. The measurement application setup according to claim 1, wherein the user input refers to a section of the measurement waveform data.

9. The measurement application setup according to claim 1, wherein the user input refers to at least one of data from a computer-aided design (CAD) software, an image, or a waveform painted or drawn on the display by the user.

10. The measurement application setup according to claim 1, wherein the signal processor is further configured to:

after receiving the user input comprising the search waveform, identify data sections in the measurement waveform data that correspond to the one of the possible search waveforms, and identify data sections in the measurement waveform data that correspond to search waveforms that are similar to the one of the possible search waveforms; and display the one of the possible search waveforms and the similar search waveforms together with an indication of a number of data sections that are identified for the one of the possible search waveforms.

11. A method for operating a measurement application setup, the measurement application setup comprising a signal processor, a display coupled to the signal processor, and a user input device coupled to the signal processor, the method comprising:

processing measurement waveform data with the signal processor;

controllably displaying at least part of the measurement waveform data on the display;

acquiring a user input via the user input device with the signal processor, the user input comprising a search waveform;

providing a user with an indication of possible search waveforms based on the user input;

receiving a selection user input that selects one of the possible search waveforms; and searching, by the signal processor, for the one of the possible search waveforms in the measurement waveform data.

12. The method according to claim 11, further comprising: identifying data sections in the measurement waveform data that correspond to the one of the possible search waveforms with the signal processor.

13. The method according to claim 12, wherein the data sections are identified based on a predetermined similarity value that the signal processor calculates for the one of the possible search waveforms and the data sections.

14. The method according to claim 12, wherein identifying the data sections comprises applying at least one of a neural network trained to identify the data sections based on the one of the possible search waveforms, a Markov model, a hidden Markov model, a wavelet or filter representation, or a dynamic time warping method with the signal processor.

15. The method according to claim 11, further comprising acquiring the measurement waveform data with a signal processing circuitry, wherein the signal processing circuitry is provided in a measurement application device.

16. The method according to claim 11, wherein the user input is received prior to controlling the display to display at least part of the measurement waveform data.

17. The method according to claim 11, wherein at least one of:

the user input refers to a section of the measurement waveform data; or the user input refers to at least one of data from a CAD software, an image, or a waveform painted or drawn on the display by the user.

18. The method according to claim 11, further comprising, after receiving the user input comprising the search waveform:

identifying data sections in the measurement waveform data that correspond to the one of the possible search waveforms;

identifying data sections in the measurement waveform data that correspond to search waveforms that are similar to the one of the possible search waveforms; and displaying the search waveform and the similar search waveforms together with an indication of a number of data sections that are identified for the one of the possible search waveforms.

19. The measurement application setup according to claim 1, wherein the user input comprises a search waveform painted or drawn on the display.

* * * * *